US008319094B2

(12) United States Patent
Hayes et al.

(10) Patent No.: US 8,319,094 B2
(45) Date of Patent: *Nov. 27, 2012

(54) MULTILAYER TERIONOMER ENCAPSULANT LAYERS AND SOLAR CELL LAMINATES COMPRISING THE SAME

(75) Inventors: Richard Allen Hayes, Beaumont, TX (US); Jane Kapur, Kennett Square, PA (US); Sam Louis Samuels, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 811 days.

This patent is subject to a terminal disclaimer.

(21) Appl. No.: 11/985,711

(22) Filed: Nov. 16, 2007

(65) Prior Publication Data

US 2009/0126781 A1     May 21, 2009

(51) Int. Cl.
 *H01L 31/048* (2006.01)
 *H01L 31/04* (2006.01)
 *B32B 37/10* (2006.01)

(52) U.S. Cl. ........ 136/251; 136/244; 428/343; 428/339; 428/412; 428/419; 428/423.1; 428/35.7; 156/60; 156/285

(58) Field of Classification Search .................. 136/251, 136/244; 428/35.7, 343, 339, 412, 419, 423.1
See application file for complete search history.

(56) References Cited

U.S. PATENT DOCUMENTS

| | | | |
|---|---|---|---|
| 3,344,014 A | 9/1967 | Rees | |
| 3,762,988 A | 10/1973 | Clock et al. | |
| 3,957,537 A | 5/1976 | Baskett et al. | |
| 4,663,228 A | 5/1987 | Bolton et al. | |
| 4,668,574 A | 5/1987 | Bolton et al. | |
| 4,799,346 A | 1/1989 | Bolton et al. | |
| 4,884,814 A | 12/1989 | Sullivan | |
| 5,476,553 A | 12/1995 | Hanoka et al. | |
| 5,478,402 A | 12/1995 | Hanoka | |
| 5,733,382 A | 3/1998 | Hanoka | |
| 5,759,698 A | 6/1998 | Tanuma et al. | |
| 5,762,720 A | 6/1998 | Hanoka et al. | |
| 5,763,062 A | 6/1998 | Smith et al. | |
| 5,895,721 A | 4/1999 | Naoumenko et al. | |
| 5,986,203 A | 11/1999 | Hanoka et al. | |
| 6,114,046 A | 9/2000 | Hanoka | |
| 6,150,028 A | 11/2000 | Mazon | |
| 6,187,448 B1 | 2/2001 | Hanoka et al. | |
| 6,217,982 B1 | 4/2001 | Dawson | |
| 6,432,522 B1 | 8/2002 | Friedman et al. | |
| 6,660,930 B1 | 12/2003 | Gonsiorawski | |
| 8,048,520 B2 | 11/2011 | Hayes et al. | |
| 2002/0155302 A1 | 10/2002 | Smith et al. | |
| 2003/0000568 A1 | 1/2003 | Gonsiorawski | |
| 2003/0114565 A1 | 6/2003 | Chen et al. | |
| 2005/0256268 A1* | 11/2005 | Chen | 525/221 |
| 2005/0279401 A1 | 12/2005 | Arhart et al. | |
| 2006/0084763 A1 | 4/2006 | Arhart et al. | |
| 2006/0165929 A1* | 7/2006 | Lenges et al. | 428/35.7 |
| 2007/0154694 A1 | 7/2007 | Samuels et al. | |
| 2009/0023867 A1 | 1/2009 | Nishijima et al. | |
| 2009/0120489 A1 | 5/2009 | Nishijima et al. | |

FOREIGN PATENT DOCUMENTS

| | | |
|---|---|---|
| EP | 1065731 A2 | 3/2001 |
| JP | 06-322334 A | 11/1994 |
| JP | 08-316508 A | 11/1996 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-064268 | 3/2005 |
| JP | 2006/032308 | 2/2006 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006/186114 | 7/2006 |
| JP | 2006-186237 A | 7/2006 |
| JP | 2006-190865 A | 7/2006 |
| JP | 2006-190867 A | 7/2006 |
| WO | WO 99/58334 A2 | 11/1999 |
| WO | WO 99/58334 A3 | 11/1999 |
| WO | WO 2006/057771 A2 | 6/2006 |
| WO | WO 2006/057771 A3 | 6/2006 |
| WO | 2006/085603 A1 | 8/2006 |
| WO | 2006/095762 A1 | 9/2006 |

OTHER PUBLICATIONS

DuPont SURLYN 1857 Zinc Ionomer Resin for Blown and Cast Film_2009_http://www.matweb.com/search/datasheet.
DuPont Material Safety Data Sheet_2005_SURLYN Ionomer Resin All in Synonym List SUR002.
PCT International Search Report and Written Opinion for International application No. PCT/US2008/083377, dated May 4, 2010.
PCT International Preliminary Report on Patentability for International application No. PCT/US2008/083377, dated May 27, 2010.
DuPont_2007_DuPont SURLYN 1857 SURLYN resins Product Data Sheet.
DuPont Packaging, SURLYN Resins, SURLYN Grade Comparison Chart_2005_http://www.dupont.com/packaging/products/surlyn/pdsprint/perfchart.html.

* cited by examiner

*Primary Examiner* — Jennifer Michener
*Assistant Examiner* — Matthew Martin

(57) ABSTRACT

The present invention provides a solar cell pre-lamination assembly comprising a terionomer multilayer film or sheet and solar cell modules prepared therefrom.

24 Claims, No Drawings

MULTILAYER TERIONOMER ENCAPSULANT LAYERS AND SOLAR CELL LAMINATES COMPRISING THE SAME

The present invention relates to a multilayer encapsulant film or sheet comprising a terionomer and a solar cell laminate comprising the same.

BACKGROUND OF THE INVENTION

As a sustainable energy resource, the use of solar cell modules is rapidly expanding. One preferred way of manufacturing a solar cell module involves forming a pre-lamination assembly comprising at least 5 structural layers. The solar cell pre-lamination assemblies are constructed in the following order starting from the top, or incident layer (that is, the layer first contacted by light) and continuing to the backing layer (the layer furthest removed from the incident layer): (1) incident layer (typically a glass plate or a thin polymeric film (such as a fluoropolymer or polyester film), but could conceivably be any material that is transparent to sunlight), (2) front encapsulant layer, (3) solar cell component, (4) back encapsulant layer, and (5) backing layer.

The encapsulant layers are designed to encapsulate and protect the fragile solar cell component. Generally, a solar cell pre-lamination assembly incorporates at least two encapsulant layers sandwiched around the solar cell component. Suitable polymeric materials used in the solar cell encapsulant layers would typically possess a combination of characteristics such as high transparency, low haze, high impact resistance, high penetration resistance, good ultraviolet (UV) light resistance, good long term thermal stability, adequate adhesion strength to glass and other rigid polymeric sheets, high moisture resistance, and good long term weatherability. In addition, the optical properties of the front encapsulant layer may be such that light can be effectively transmitted to the solar cell component.

The use of ionomers, which are derived from partially or fully neutralized acid copolymers of α-olefins and α,β-ethylenically unsaturated carboxylic acids, in solar cell encapsulant layers has been disclosed in, e.g., U.S. Pat. Nos. 5,476,553; 5,478,402; 5,733,382; 5,762,720; 5,986,203; 6,114,046; 6,187,448; and 6,660,930, U.S. Pat Appl. Nos. 2003/0000568; 2005/0279401; 2006/0084763; and 2006/0165929, and Japanese Pat Nos. JP 2000186114 and JP 2006032308. Similar ionomer compositions have also been used as safety glass interlayers (see, e.g., U.S. Pat. Nos. 3,344,014; 3,762,988; 4,663,228; 4,668,574; 4,799,346; 5,759,698; 5,763,062; 5,895,721; 6,150,028; 6,432,522, U.S. Pat Appl Nos. 2002/0155302 and 2002/0155302, and PCT Appl Nos. WO 99/58334 and WO 2006/057771).

Terionomers, which are derived from partially or fully neutralized acid terpolymers of α-olefins, α,β-ethylenically unsaturated carboxylic acids, and α,β-ethylenically unsaturated carboxylic acid esters, have also been used in forming solar cell encapsulant layers (see e.g., U.S. Pat Appl No. 2006/0165929 and Japanese Pat No. JP 2006032308). Similar terionomer compositions have also been used as safety glass interlayers (see; U.S. Pat. Nos. 3,344,014 and 5,759,698, and U.S. Pat Appl No. 2007/0154694).

However, the solar cell encapsulant layers formed of such ionomers often fail to provide adequate protection to the solar cell component from shock. Additionally, the low light transmission and low adhesion to other laminate layers, especially after severe environmental aging, also hinders the use of such ionomers in solar cell encapsulant layers. On the other hand, in addition to low light transmission and low adhesion to other laminate layers, less heat resistance is associated with solar cell encapsulant layers derived from the terionomers, due to their low melting points.

There is a need for polymeric films or sheets suitable as solar cell encapsulant layers, which are transparent, highly adhesive to other laminate layers, and moisture and heat resistant.

SUMMARY OF THE INVENTION

The invention is directed to a solar cell pre-lamination assembly comprising a terionomer multilayer film or sheet and a solar cell component formed of one or a plurality of electronically interconnected solar cells, wherein, (i) the solar cell component has a light-receiving side that faces a light source and a back side that is opposite from the light source; (ii) the terionomer multilayer film or sheet comprises a first surface sub-layer, a second surface sub-layer, and optionally one or more inner sub-layers sandwiched between the first and second surface sub-layers; (iii) the first surface sub-layer of the terionomer multilayer film or sheet comprises a terionomer; (iv) the second surface sub-layer of the terionomer multilayer film or sheet, at least one of the optional inner sub-layer(s) of the terionomer multilayer film or sheet, or both, comprises a high melting point polymer; (v) the terionomer is derived from an acid terpolymer that is about 5% to about 90% neutralized with one or more metal ions, based on the total carboxylic acid content of the acid terpolymer, and comprises repeat units derived from an α-olefin, about 5 to about 15 wt % of an α,β-ethylenically unsaturated carboxylic acid having 3 to 8 carbons, and about 15 to about 40 wt % of an α,β-ethylenically unsaturated carboxylic acid ester having 4 to 12 carbons, based on the total weight of the acid terpolymer; and (vi) the high melting point polymer has a melting point of at least about 80° C.

The invention is further directed to a process comprising:
(i) providing a solar cell pre-lamination assembly, as described above, and
(ii) laminating the assembly to form a solar cell module.

The invention is yet further directed to a solar cell module prepared by laminating the solar cell pre-lamination assembly, as described above.

DETAILED DESCRIPTION OF THE INVENTION

The term "acid copolymer" refers to a polymer comprising copolymerized units derived from an α-olefin, an α,β-ethylenically unsaturated carboxylic acid, and optionally other suitable comonomers such as, for example, an α,β-ethylenically unsaturated carboxylic acid ester.

The term "acid terpolymer" refers to a species of acid copolymers, which comprise copolymerized units derived from an α-olefin, an α,β-ethylenically unsaturated carboxylic acid, and an α,β-ethylenically unsaturated carboxylic acid ester.

The term "ionomer" refers to a polymer that is derived from a parent acid copolymer, as disclosed above, by partially or fully neutralizing the parent acid copolymer.

The term "terionomer" refers to a species of ionomers, which are derived from a parent acid terpolymer, as disclosed above.

Terionomer Multilayer Films and Sheets

The terionomer multilayer polymeric film or sheet has two or more sub-layers, wherein at least one of the surface sub-layers is formed of a terionomer composition, and wherein the terionomer is derived from a parent acid terpolymer that contains, based on the total weight of the acid terpolymer, repeat units derived from an α-olefin having 2 to 10 carbons, about 5 to about 15 wt % of an α,β-ethylenically unsaturated carboxylic acid having 3 to 8 carbons, and about 15 to about 40 wt % of an α,β-ethylenically unsaturated carboxylic acid ester having 4 to 12 carbons and is 5% to 90% neutralized with a metal ion, based on the total carboxylic acid content of the acid terpolymer. The term "surface sub-layers" refers to the two sub-layers forming the two outer surfaces of the terionomer multilayer film or sheet. In addition, the terionomer multilayer film or sheet further comprises at least one sub-layer, preferably, an inner sub-layer, formed of a polymer composition with a melting point of about 80° C. or higher. The term "inner sub-layers" refers to the sub-layer(s) that is positioned between the two surface sub-layers. When in a bi-layer form, the terionomer multilayer film or sheet comprises a first sub-layer comprising the terionomer composition and a second sub-layer comprising the high melting point polymer composition. In addition, when the multilayer film or sheet has three or more sub-layers, it is preferred that at least one of the two surface sub-layers, or more preferably both of the two surface sub-layers, are formed of the terionomer composition and at least one of the other sub-layers, or more preferably at least one of the inner sub-layer(s) is formed of the high melting point polymer composition. The other sub-layer(s) of the multilayer film or sheet may be formed of any other suitable polymer compositions. An exemplary suitable polymer composition may comprise a polymeric material selected from acid copolymers, ionomers, poly(ethylene-co-vinyl acetates), poly(vinyl acetals) (e.g., poly(vinyl butyrals)), thermoplastic polyurethanes, poly(vinyl chlorides), polyethylenes (e.g., metallocene-catalyzed linear low density polyethylenes), polyolefin block elastomers, poly(α-olefin-co-α,β-ethylenically unsaturated carboxylic acid ester) copolymers (e.g., poly(ethylene-co-methyl acrylate) and poly(ethylene-co-butyl acrylate)), silicone elastomers, epoxy resins, and mixtures of two or more thereof.

Preferably, the parent acid terpolymer comprises about 7 to about 11 wt %, or about 9 wt % repeat units of the α,β-ethylenically unsaturated carboxylic acid, and about 20 to about 30 wt %, or about 23 to about 24 wt % repeat units of the α,β-ethylenically unsaturated carboxylic acid ester, based on the total weight of the acid terpolymer.

The α-olefin comonomers may include, but are not limited to, ethylene, propylene, 1-butene, 1-pentene, 1-hexene, 1-heptene, 3 methyl-1-butene, 4-methyl-1-pentene, and the like and mixtures of two or more thereof. Preferably, the α-olefin is ethylene.

The α,β-ethylenically unsaturated carboxylic acid comonomers may include, but are not limited to, acrylic acids, methacrylic acids, itaconic acids, maleic acids, maleic anhydrides, fumaric acids, monomethyl maleic acids, and mixtures of two or more thereof. Preferably, the α,β-ethylenically unsaturated carboxylic acid is selected from acrylic acids, methacrylic acids, and mixtures of two or more thereof.

The α,β-ethylenically unsaturated carboxylic acid ester comonomers may include, but are not limited to, methyl acrylates, methyl methacrylates, ethyl acrylates, ethyl methacrylates, isopropyl acrylates, isopropyl methacrylates, butyl acrylates, butyl methacrylates, and mixtures of two or more thereof. Preferably, the α,β-ethylenically unsaturated carboxylic acid ester is selected from methyl acrylates and butyl acrylates.

The parent acid terpolymers may be polymerized as disclosed in U.S. Pat. Nos. 3,404,134; 5,028,674; 6,500,888; and 6,518,365.

To obtain the terionomers, the parent acid terpolymers may be about 10% to about 50%, or about 20% to about 40%, neutralized with metallic ions, based on the total carboxylic acid content of the parent acid terpolymers. The metallic ions may be monovalent, divalent, trivalent, multivalent, or mixtures thereof. Useful monovalent metallic ions include, but are not limited to, sodium, potassium, lithium, silver, mercury, copper, and mixtures of two or more thereof. Useful divalent metallic ions include, but are not limited to, beryllium, magnesium, calcium, strontium, barium, copper, cadmium, mercury, tin, lead, iron, cobalt, nickel, zinc, and mixtures of two or more thereof. Useful trivalent metallic ions include, but are not limited to, aluminum, scandium, iron, yttrium, and mixtures of two or more thereof. Useful multivalent metallic ions include, but are not limited to, titanium, zirconium, hafnium, vanadium, tantalum, tungsten, chromium, cerium, iron, and mixtures of two or more thereof. It is noted that when the metallic ion is multivalent, complexing agents, such as stearate, oleate, salicylate, and phenolate radicals are included, as disclosed within U.S. Pat. No. 3,404,134. Preferably, the metallic ions are selected from sodium, lithium, magnesium, zinc, and mixtures of two or more thereof. More preferably, the metallic ions are selected from sodium, zinc, and mixtures therefrom. Most preferably, the metallic ions are zinc. The parent acid terpolymers may be neutralized as disclosed in U.S. Pat. No. 3,404,134.

A preferred example of the terionomers is derived from a poly(ethylene-co-butyl acrylate-co-methacrylic acid), wherein about 20% to about 40% of the methacrylic acids are neutralized with zinc ions.

The high melting point polymer composition preferably has a melting point of at least about 90° C. or at least about 95° C.

More preferably, the high melting point polymer compositions comprises a polymer selected from acid copolymers, ionomers, poly(ethylene-co-vinyl acetates), thermoplastic polyurethanes, poly(vinyl chlorides), polyethylenes, poly(α-olefin-co-α,β-ethylenically unsaturated carboxylic acid ester) copolymers (e.g., poly(ethylene-co-methyl acrylates) and poly(ethylene-co-butyl acrylates)), polyesters (e.g., PETG amorphous polyesters (Eastman Chemical Company, Kingsport, Tenn.)), and epoxy resins. Preferably, the high melting point polymer compositions comprise polymers selected from acid copolymers and ionomers.

Yet more preferably, the high melting point polymer composition comprises an ionomer derived from an acid copolymer that comprises copolymerized units of an α-olefin and an α,β-ethylenically unsaturated carboxylic acid and is neutralized to a level of about 1% to about 90%, or about 10% to about 40%, based on the total carboxylic acid content of the acid copolymer, with a metallic ion, as described in preparing the terionomers. Preferably, the metallic ion is selected from sodium, zinc, magnesium, and lithium. The most preferred metal ion used here to neutralize the acid copolymer is zinc. Specific exemplary ionomer compositions include those Surlyn® products available from E.I. du Pont de Nemours and Company, Wilmington, Del. (DuPont).

The polymer compositions may further comprise any suitable additives known within the art including plasticizers, processing aides, lubricants, flame retardants, impact modifiers, nucleating agents, antiblocking agents (e.g., silica), thermal stabilizers, UV absorbers, UV stabilizers, dispersants, surfactants, chelating agents, coupling agents, adhesives, primers, or mixtures of two or more thereof. The total amount of additives comprised in a composition may be from about 0.001 up to about 5 wt %, based on the total weight of the composition.

The terionomer composition optionally further comprises one or more silane coupling agents to further enhance the adhesion strength of the multilayer films or sheets comprising the same. Exemplary coupling agents include, but are not limited to, γ-chloropropylmethoxysilane, vinyltrimethoxysilane, vinyltriethoxysilane, vinyltris(β-methoxyethoxy)silane, γ-vinylbenzylpropyltrimethoxysilane, N-β-(N-vinylbenzylaminoethyl)-γ-aminopropyltrimethoxysilane, γ-methacryloxypropyltrimethoxysilane, vinyltriacetoxysilane, γ-glycidoxypropyltrimethoxysilane, γ-glycidoxypropyltriethoxysilane, γ-(3,4-epoxycyclohexyl)ethyltrimethoxysilane, vinyltrichlorosilane, γ-mercaptopropylmethoxysilane, γ-aminopropyltriethoxysilane, N-β-(aminoethyl)-γ-aminopropyltrimethoxysilane, and mixtures of two or more thereof. The silane coupling agents are preferably present in the terionomer composition at a level of about 0.01 to about 5 wt %, or about 0.05 to about 1 wt %, based on the total weight of the composition. More preferably, however, the terionomer compositions do not comprise any adhesion promoting agents, such as the above mentioned silane coupling agents.

The high melting point polymer compositions optionally further comprises additives to reduce the melt flow of the resin, to the limit of thermosetting the films or sheets derived therefrom during lamination and therefore provide lamination products comprising the same with even greater thermal resistance and fire resistance. By the addition of such additives, the end-use temperature may be enhanced by about 20° C. to about 70° C. Typically, the effective melt flow reducing additives are organic peroxides, such as 2,5-dimethylhexane-2,5-dihydroperoxide, 2,5-dimethyl-2,5-di(tert-betyl peroxy) hexane-3, d i-tert-butyl peroxide, tert-butylcumyl peroxide, 2,5-dimethyl-2,5-di(tert-butylperoxy)hexane, dicumyl peroxide, α,α'-bis(tert-butyl-peroxyisopropyl)benzene, n-butyl-4,4-bis(tert-butylperoxy)valerate, 2,2-bis(tert-butylperoxy) butane, 1,1-bis(tert-butyl-peroxy)cyclohexane, 1,1-bis(tert-butylperoxy)-3,3,5-trimethyl-cyclohexane, tert-butyl peroxybenzoate, benzoyl peroxide, and the like and combinations of two or more thereof. The organic peroxides may decompose at a temperature of about 100° C. or higher to generate radicals or have a decomposition temperature which affords a half life of 10 hours at about 70° C. or higher to provide improved stability for blending operations. The organic peroxides may be added at a level of about 0.01 to about 10 wt %, or about 0.5 to about 3.0 wt %, based on the total weight of the composition.

If desired, initiators, such as dibutyltin dilaurate, may be contained in the terionomer compositions at a level of about 0.01 to about 0.05 wt %, based on the total weight of the composition. In addition, if desired, inhibitors, such as hydroquinone, hydroquinone monomethyl ether, p-benzoquinone, and methylhydroquinone, may be added to the terionomer compositions at a level of less than about 5 wt %, based on the total weight of the composition.

A flow-reducing additive disclosed above may also be absent from the terionomer compositions or the high melting point polymer compositions to allow the entire multilayer sheet to be thermoplastic and to allow for recycling.

Each of the terionomer containing surface sub-layer(s) may have a thickness of about 0.5 mils (0.013 mm) to about 5 mils (0.13 mm), or about 0.5 mils to about 3 mils (0.076 mm), and each of the high melting point polymer containing inner sub-layer(s) may have a thickness of about 0.5 mils (0.013 mm) to about 19 mils (0.48 mm), or about 1 mils (0.025 mm) to about 15 mils (0.38 mm), or about 2 mils (0.051 mm) to about 10 mils (0.25 mm). The total thickness of the multilayer films or sheets may be in the range of about 2 mils (0.051 mm) and about 20 mils (0.51 mm).

When the terionomer multilayer film or sheet is comprised in a flexible solar cell laminate as an encapsulant layer film, it is preferred to have a thickness of about 2 mils (0.051 mm) to about 10 mils (0.25 mm), or about 2 mils (0.051 mm) to about 5 mils (0.13 mm). When the terionomer multilayer film or sheet is comprised in a rigid solar cell laminate as an encapsulant layer sheet, it is preferred to have a thickness of about 10 mils (0.25 mm) to about 20 mils (0.51 mm). The terionomer multilayer films and sheets may have any thickness desired to meet the needs of the solar cell module they are incorporated in.

The terionomer multilayer films or sheets may have smooth or rough surfaces on one or both sides. Preferably, the multilayer films or sheets have rough surfaces on both sides to facilitate the deareation of the laminates during the laminate process. Rough surfaces can be made by mechanically embossing or by melt fracture during extrusion of the multilayer films or sheets followed by quenching so that the roughness is retained during handling. The surface pattern can be applied to the terionomer multilayer film or sheet through common art processes. For example, the as-extruded multilayer film or sheet may be passed over a specially prepared surface of a die roll positioned in close proximity to the exit of the die which imparts the desired surface characteristics to one side of the molten polymer. Thus, when the surface of such a die roll has minute peaks and valleys, the polymer film or sheet cast thereon will have a rough surface on the side which contacts the roll which generally conforms respectively to the valleys and peaks of the roll surface. Such die rolls are disclosed in, e.g., U.S. Pat. No. 4,035,549, U.S. Pat Appl No. 2003/0124296, and U.S. Pat Appl No. 11/725,622, filed Mar. 20, 2007.

The terionomer multilayer film or sheet has a percent (light) transmission of about 80% to about 100%, as measured by ASTM D1003. Preferably, the terionomer multilayer film or sheet has a percent transmission of about 90% to about 100%. In addition, it desirably provides a percent clarity of about 90% to 100%, or about 95% to 100%, or about 98% to 100%, as measured by ASTM D1003.

The terionomer multilayer films or sheets can be produced by any suitable process. For example, the multilayer films or sheets may be formed through dipcoating, solution casting, compression molding, injection molding, lamination, melt extrusion, blown film, extrusion coating, tandem extrusion coating, or any other procedures that are known to those of skill in the art. Preferably, the multilayer films or sheets are formed by melt coextrusion, melt extrusion coating, or tandem melt extrusion coating processes.

Laminates

The invention further provides a solar cell pre-lamination assembly comprising at least one layer of the terionomer multilayer film or sheet and a solar cell module derived therefrom.

The use of such terionomer multilayer film or sheet in cell modules may provide advantages over other prior art ionomer or terionomer films or sheet. First, the terionomer multilayer films or sheets possess enhanced transparency. Secondly, when compared to the prior art ionomer sheet or films, the terionomer multilayer film of sheet has improved adhesion strength to other laminate layers, such as glass, especially after severe environmental aging, such as after being kept under-high temperature (e.g., about 75° C. or higher) and high humidity (e.g., relative humidity of about 85% or higher) conditions for a prolonged period of time (e.g., about 750 hours or longer). (See e.g., Table 3). Thirdly, the addition of the high melting point polymer in the multilayer film or sheet may further provide improved thermal resistance.

The solar cell pre-lamination assembly comprises a solar cell component formed of one or a plurality solar cells and at least one layer of the terionomer multilayer film or sheet described above.

Solar cell is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells.

Thin film solar cells may be produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620.

The solar cell pre-lamination assembly may comprise at least one layer of the terionomer multilayer film or sheet, which is positioned next to the solar cell component and serves as one of the encapsulant layers, or preferably, the terionomer multilayer film or sheet is positioned next to the solar cell component to the light-receiving side and serves as the front encapsulant layer.

The solar cell pre-lamination assembly may further comprise encapsulant layers formed of other polymeric materials, such as, acid copolymers, ionomers, ethylene vinyl acetates, poly(vinyl acetals) (including acoustic grade poly(vinyl acetals), polyurethanes, polyvinylchlorides, polyethylenes (e.g., linear low density polyethylenes), polyolefin block elastomers, poly($\alpha$-olefin-co-$\alpha,\beta$-ethylenically unsaturated carboxylic acid ester) copolymers (e.g., poly(ethylene-co-methyl acrylate) and poly(ethylene-co-butyl acrylate)), silicone elastomers, epoxy resins, and combinations of two or more thereof. Preferably, the solar cell pre-lamination assembly comprises two layers of the terionomer multilayer film or sheet, wherein each of the two terionomer multilayer films or sheets are laminated to each of the two sides of the solar cell component and serve as the front and back encapsulant layers.

The thickness of the individual encapsulant layers other than the multilayer film(s) or sheet(s) may independently range from about 1 mil (0.026 mm) to about 120 mils (3 mm), or from about 1 mil to about 40 mils (1.02 mm), or from about 1 mil to about 20 mils (0.51 mm). All the encapsulant layer(s) comprised in the solar cell pre-lamination assemblies, may have smooth or rough surfaces. Preferably, the encapsulant layer(s) have rough surfaces to facilitate the deareation of the laminates through the lamination process.

The solar cell pre-lamination assembly may yet further comprise an incident layer and/or a backing layer serving as the outer layers of the assembly at the light-receiving side and the back side, respectively.

The outer layers of the solar cell pre-lamination assemblies, i.e., the incident layer and the backing layer, may be derived from any suitable sheets or films. Suitable sheets may be glass or plastic sheets, such as, polycarbonates, acrylics, polyacrylates, cyclic polyolefins (e.g., ethylene norbornene polymers), polystyrenes (preferably metallocene-catalyzed polystyrenes), polyamides, polyesters, fluoropolymers and the like and combinations of two or more thereof. In addition, metal sheets, such as aluminum, steel, galvanized steel, or ceramic plates may be utilized in forming the backing layer.

The term "glass" includes not only window glass, plate glass, silicate glass, sheet glass, low iron glass, tempered glass, tempered CeO-free glass, and float glass, but also colored glass, specialty glass (such as those include ingredients to control, e.g., solar heating), coated glass (such as those sputtered with metals (e.g., silver or indium tin oxide) for solar control purposes), E-glass, Toroglass, Solex® glass (PPG Industries, Pittsburgh, Pa.) and Starphire® glass (PPG Industries). Such specialty glasses are disclosed in, e.g., U.S. Pat. Nos. 4,615,989; 5,173,212; 5,264,286; 6,150,028; 6,340,646; 6,461,736; and 6,468,934. It is understood, however, that the type of glass to be selected for a particular laminate depends on the intended use.

Suitable film layers may be polymers including, but not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, poly(vinyl chlorides) (e.g., poly(vinylidene chloride)), fluoropolymers (e.g., polyvinyl fluoride, polyvinylidene fluoride, polytetrafluoroethylene, ethylene-tetrafluoroethylene copolymers, etc.) and combinations of two or more thereof. The polymeric film may be bi-axially oriented polyester film (preferably poly(ethylene terephthalate) film) or a fluoropolymer film (e.g., Tedlar®, Tefzel®, and Teflon® films, from DuPont). Fluoropolymer-polyester-fluoropolymer (TPT) films are also preferred for some applications. Metal films, such as aluminum foil may also be used as the back-sheet.

The solar cell pre-lamination assembly may further comprise other functional film or sheet layers (e.g., dielectric layers or barrier layers) embedded within the assembly. Such functional layers may be derived from any of the above mentioned polymeric films or those that are coated with additional functional coatings. For example, poly(ethylene terephthalate) films coated with a metal oxide coating, such as those disclosed within U.S. Pat. Nos. 6,521,825; 6,818,819, and EP1182710, may function as oxygen and moisture barrier layers in the laminates.

If desired, one or both surfaces of the incident layer films and sheets, backing layer films and sheets, terionomer multilayer film or sheet and other layers incorporated within the solar cell laminate may be treated to enhance the adhesion to other laminate layers. This adhesion enhancing treatment may take any form known within the art and include flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof. Also, the adhesion strength may be further improved by further applying an adhesive or primer coating on the surface of laminate layer(s). For example, U.S. Pat. No. 4,865,711 discloses a film or sheet with improved bondability, which has a thin layer of carbon deposited on one or both surfaces. Other exemplary adhesives or primers may include silanes, poly (allyl amine) based primers (see e.g., U.S. Pat. Nos. 5,411,845; 5,770,312; 5,690,994; and 5,698,329), and acrylic based primers (see e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

If desired, a layer of non-woven glass fiber (scrim) may also be included in the solar cell laminates to facilitate deareation during the lamination process or to serve as reinforcement for the encapsulant layer(s). The use of such scrim layers within solar cell laminates is disclosed within, e.g., U.S. Pat. Nos. 5,583,057; 6,075,202; 6,204,443; 6,320,115; 6,323,416, and EP0769818.

The film or sheet layers positioned to the light-receiving side of the solar cell component may be made of transparent material to allow efficient transmission of sunlight into the solar cell component. A special film or sheet may be included to serve both the function of an encapsulant layer and an outer layer. Any of the film or sheet layers included in the assembly may be in the form of a pre-formed single-layer or multi-layer film or sheet.

If desired, one or both surfaces of the laminate layers of the solar cell pre-lamination assemblies may be treated to enhance the adhesion strength, as described above.

Preferably, the terionomer multilayer films and sheets do not undergo any adhesion enhancing treatment and are self-adhered to the other laminate layers.

The solar cell pre-lamination assemblies may take any form known within the art. Preferable specific solar cell pre-lamination constructions (top (light receiving) side to back side) include, glass/TI/solar cell/TI/glass;
glass/TI/solar cell/TI/fluoropolymer film (e.g., Tedlar® film);
fluoropolymer film/TI/solar cell/TI/glass;
fluoropolymer film/TI/solar cell/TI/fluoropolymer film;
glass/TI/solar cell/TI/polyester film (e.g., poly(ethylene terephthalate) film);
fluoropolymer film/TI/solar cell/TI/polyester film;
glass/TI/solar cell/TI/barrier coated film/TI/glass;
fluoropolymer film/TI/barrier coated film/TI/solar cell/TI/barrier coated film/TI/fluoropolymer film;
glass/TI/solar cell/TI/aluminum stock;
fluoropolymer film/TI/solar cell/TI/aluminum stock;
glass/TI/solar cell/TI/galvanized steel sheet;
glass/TI/solar cell/TI/polyester film/TI/aluminum stock;
fluoropolymer film/TI/solar cell/TI/polyester film/TI/aluminum stock;
glass/TI/solar cell/TI/polyester film/TI/galvanized steel sheet;
fluoropolymer film/TI/solar cell/TI/polyester film/TI/galvanized steel sheet;
glass/TI/solar cell/poly(vinyl butyral) encapsulant layer/glass; glass/TI/solar cell/poly(vinyl butyral) encapsulant layer/fluoropolymer film;
fluoropolymer film/TI/solar cell/acid copolymer encapsulant layer/fluoropolymer film;
glass/TI/solar cell/ethylene vinyl acetate encapsulant layer/polyester film;
fluoropolymer film/TI/solar cell/poly(ethylene-co-methyl acrylate) encapsulant layer/polyester film;
glass/poly(ethylene-co-butyl acrylate) encapsulant layer/solar cell/TI/barrier coated film/poly(ethylene-co-butyl acrylate) encapsulant layer/glass;

and the like, wherein "TI" stands for the terionomer multilayer film or sheet. In addition, besides the Tedlar® film from DuPont, suitable fluoropolymer films also include TPT trilayer films.

The invention further provides solar cell laminates derived from the solar cell pre-lamination assemblies disclosed above. Specifically the solar cell laminates are formed by subjecting the solar cell pre-lamination assemblies to further lamination process, as provided below in detail.

Lamination Process

Any lamination process known within the art may be used to prepare the solar cell laminates from the solar cell pre-lamination assembly. The lamination process may be an autoclave or non-autoclave process.

In an exemplary process, the component layers of a pre-lamination solar cell assembly are stacked up in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., about 27-28 inches Hg (689-711 mm Hg)), and the sealed bag is placed in an autoclave at a pressure of about 150 to about 250 psi (about 11.3-18.8 bar), a temperature of about 130° C. to about 180° C., or about 120° C. to about 160° C., or about 135° C. to about 160° C., or about 145° C. to about 155° C., for about 10 to about 50 minutes, or about 20 to about 45 minutes, or about 20 to about 40 minutes, or about 25 to about 35 minutes. A vacuum ring may be substituted for the vacuum bag. One type of suitable vacuum bags is disclosed within U.S. Pat. No. 3,311,517. Following the heat and pressure cycle, the air in the autoclave is cooled without adding additional gas to maintain pressure in the autoclave. After about 20 minutes of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 minutes, and thereafter, the heated assembly is passed through a set of nip rolls so that the air in the void spaces between the individual layers may be squeezed out, and the edge of the assembly sealed. The assembly at this stage is referred to as a pre-press.

The pre-press may then be placed in an air autoclave where the temperature is raised to about 120° C. to about 160° C., or about 135° C. to about 160° C., at a pressure of about 100 to about 300 psi (about 6.9 to about 20.7 bar), or about 200 psi (13.8 bar). These conditions are maintained for about 15 to about 60 minutes, or about 20 to about 50 minutes, and after which, the air is cooled while no more air is added to the autoclave. After about 20 to about 40 minutes of cooling, the excess air pressure is vented, the laminated products are removed from the autoclave.

The solar cell laminates may also be produced through non-autoclave processes. Such non-autoclave processes are disclosed, for example, within U.S. Pat. Nos. 3,234,062; 3,852,136; 4,341,576; 4,385,951; 4,398,979; 5,536,347; 5,853,516; 6,342,116; 5,415,909; U.S. Pat Appl No. 2004/0182493; European Pat No. EP1235683 B1; and PCT Pat Appl Nos. WO91/01880 and WO03/057478 A1. Generally, the non-autoclave processes include heating the pre-lamination assembly and the application of vacuum, pressure or both. For example, the assembly may be successively passed through heating ovens and nip rolls.

Essentially any lamination process may be used.

EXAMPLES

The following Examples and Comparative Examples are intended to be illustrative of the present invention, and are not intended in any way to limit the scope of the present invention.

Melt Index

Melt Index (MI) is measured by ASTM D1238 at 190° C. using a 2160 g load.

Melting Point

Melting point is measured by differential scanning calorimetry (DSC).

Lamination Process 1

The component layers of the laminate are stacked to form a pre-lamination assembly. For the assembly containing a polymeric film layer as the outer surface layer, a cover glass sheet is placed over the film layer. The pre-lamination assembly is then placed within a Meier ICOLAM® 10/08 laminator (Meier laminator; Meier Vakuumtechnik GmbH, Bocholt, Germany). The lamination cycle includes an evacuation step (vacuum of 3 in Hg (76 mm Hg)) of 5.5 minutes and a pressing stage (pressure of 1000 mbar) of 5.5 minutes at a temperature of 145° C. The resulting laminate is then removed from the laminator.

Lamination Process 2

The component layers of the laminate are stacked to form a pre-lamination assembly. For the assembly containing a polymeric film layer as the outer surface layer, a cover glass sheet is placed over the film layer. The pre-lamination assembly is then placed within a vacuum bag, which is sealed and a vacuum is applied to remove the air from the vacuum bag. The bag is placed into an oven and heated to about 90° C. to about 100° C. for 30 minutes to remove any air contained between the assembly. The assembly is then subjected to autoclaving at 140° C. for 30 minutes in an air autoclave to a pressure of 200 psig (14.3 bar). The air is cooled while no more air is added to the autoclave. After 20 minutes of cooling and when the air temperature reaches less than about 50° C., the excess pressure is vented, and the resulting laminate is removed from the autoclave.

Materials

The following films and sheets are used in the examples:

AL is a 3.2 mm thick aluminum sheet that is 5052 alloyed with 2.5 wt % of magnesium and conforms to Federal specification QQ-A-250/8 and ASTM B209;

EVA is SC50B, believed to be a formulated composition based on poly(ethylene-co-vinyl acetate) in the form of a 20 mil thick (0.51 mm) sheet (Hi-Sheet Industries, Japan);

FPF is a 1.5 mil (0.038 mm) thick corona surface treated Tedlar® film (DuPont);

Glass 1 is 2.5 mm thick float glass;

Glass 2 is a 3.0 mm thick clear annealed float glass plate layer;

Glass 3 is a 3.0 mm thick Solex® solar control glass from the PPG Industries, Pittsburgh, Pa.;

Glass 4 is Starphire® glass from the PPG Industries;

ION 1 is a 60 mil (1.52 mm) thick embossed sheet made of Ionomer A, which has a MI of approximately 2 g/10 min and is derived from a poly(ethylene-co-methacrylic acid) that contains, based on the total weight of the acid copolymer, 22 wt % repeat units of methacrylic acid, and has 27% of its total carboxylic acid content neutralized with sodium ion;

ION 2 is a 20 mil (0.51 mm) thick embossed sheet made of Ionomer B. which has a MI of 2 g/10 min and is derived from a poly(ethylene-co-methacrylic acid) that contains, based on the total weight of the acid copolymer, 19 wt % repeat units of methacrylic acid, and has 37% of its total carboxylic acid content neutralized with zinc ion;

ION 3 is a 20 mil (0.51 mm) thick embossed sheet made of Surlyn® 9950 (DuPont);

ION 4 was an ionomer having a MI of 5 g/10 min and a melting point of 87° C. and derived from a poly(ethylene-co-methacrylic acid) that contained, based on the total weight of the acid copolymer, 15 wt % repeat units of methacrylic acid, and had 23% of its total carboxylic acid content neutralized with zinc ion;

ION 5 was an ionomer having a MI of 4.5 g/10 min and a melting point of 88° C. and derived from a poly(ethylene-co-methacrylic acid) that contained, based on the total weight of the acid copolymer, 15 wt % repeat units of methacrylic acid, and had 51% of its total carboxylic acid content neutralized with zinc ion;

ION 6 was an ionomer having a MI of 14 g/10 min and a melting point of 88° C. and derived from a poly(ethylene-co-methacrylic acid) that contained, based on the total weight of the acid copolymer, 15 wt % repeat units of methacrylic acid, and had 22% of its total carboxylic acid content neutralized with zinc ion;

PET 1 is a 7 mils (0.18 mm) thick poly(allyl amine)-primed, biaxially-oriented poly(ethylene terephthalate) film layer;

PET 2 is a XIR®-70 HP Auto film (Southwall Company, Palo Alto, Calif.);

PET 3 is a XIR®-75 Auto Blue V-1 film (Southwall);

PET 4 is a Soft Look® UV/IR 25 solar control film (Tomoegawa Paper Company, Ltd., Tokyo, Japan);

PET 5 is a XIR®-75 Green film (Southwall);

PET 6 is RAYBARRIER® TFK-2583 solar control film (Sumitomo Osaka Cement, Japan);

PVB-A is a 20 mil thick (0.51 mm) embossed sheet of an acoustic grade of poly(vinyl butyral);

PVB-B is B51V, believed to be a formulated composition based on poly(vinyl butyral) in the form of a 20 mil thick (0.51 mm) sheet (DuPont);

Solar Cell 1 is a 10×10 in (254×254 mm) amorphous silicon photovoltaic device comprising a stainless steel substrate (125 μm thick) with an amorphous silicon semiconductor layer (see, e.g., U.S. Pat. No. 6,093,581, Example 1);

Solar Cell 2 is a 10×10 in (254×254 mm) copper indium diselenide (CIS) photovoltaic device (see, e.g., U.S. Pat. No. 6,353,042, column 6, line 19);

Solar Cell 3 is a 10×10 in (254×254 mm) cadmium telluride (CdTe) photovoltaic device (see, e.g., U.S. Pat. No. 6,353,042, column 6, line 49);

Solar Cell 4 is a silicon solar cell made from a 10×10 in (254×254 mm) polycrystalline EFG-grown wafer (see, e.g., U.S. Pat. No. 6,660,930, column 7, line 61);

TI 1 is a 30 mil (0.76 mm) thick embossed trilayer sheet having two 2 mil (0.06 mm) thick surface sub-layers made of Terionomer A and an inner sub-layer made of Surlyn® 9520 (DuPont), wherein Terionomer A is derived from a poly(ethylene-co-n-butylacrylate-co-methacrylic acid) that contains, based on the total weight of the acid terpolymer, 23 wt % repeat units of n-butylacrylate and 9 wt % repeat units of methacrylic acid and has 40% of its total carboxylic acid content neutralized with zinc;

TI 2 is a 60 mil (1.52 mm) thick embossed trilayer sheet having two 1 mil (0.03 mm) thick surface sub-layers made of a composition comprising, based on the total weight of the composition, 99.85 wt % of Terionomer B and 0.15 wt % of TINUVIN 328 (Ciba Specialty Chemicals, Tarrytown, N.Y.), and an inner sub-layer made of Ionomer C, wherein Terionomer B has a MI of 10 g/10 min and is derived from a poly(ethylene-co-n-butylacrylate-co-methacrylic acid) that contains, based on the total weight of the acid terpolymer, 24 wt % repeat units of n-butylacrylate and 9 wt % repeat units of methacrylic acid and has 20% of its total carboxylic acid content neutralized with zinc ions and Ionomer C has a MI of 5 g/10 min and is derived from a poly(ethylene-co-methacrylic acid) that contains, based on the total weight of the acid copolymer, 15 wt % repeat units of methacrylic acid and has 70% of its total carboxylic acid content neutralized with sodium;

TI 3 is a 15 mil (0.38 mm) thick embossed trilayer sheet having two 1 mil (0.03 mm) thick surface sub-layers made of Terionomer B and an inner sub-layer made of Surlyn® 8660 (DuPont);

TI 4 is a 90 mil (2.25 mm) thick embossed trilayer sheet having two 2 mil (0.06 mm) thick surface sub-layers made of Terionomer A and an inner sub-layer made of Ionomer D, wherein Ionomer D has a MI of 1.5 g/10 min and is derived from a poly(ethylene-co-methacrylic acid) that contains, based on the total weight of the acid copolymer, 22 wt % repeat units of methacrylic acid and has 35% of its total carboxylic acid content neutralized with sodium;

TI 5 is a 20 mil (0.51 mm) thick embossed bilayer sheet having a first 1 mil (0.03 mm) thick sub-layer made of Terionomer C and second sub-layer made of Surlyn® 8940 (DuPont), wherein Terionomer C has a MI of 5 g/10 min and is derived from a poly(ethylene-co-n-butylacrylate-co-methacrylic acid) that contains, based on the total weight of the acid terpolymer, 24 wt % repeat units of n-butylacrylate and 9 wt % repeat units of methacrylic acid and has 30% of its total carboxylic acid content neutralized with zinc;

TI 6 is a 20 mil (0.51 mm) thick embossed trilayer sheet having two 2 mil (0.06 mm) thick surface sub-layers made of a composition comprising, based on the total weight of the composition, 99.5 wt % of Terionomer C and 0.5 wt % of CYASORB UV-1164 (Cytec Industries Inc., West Paterson, N.J.) and an inner sub-layer made of Ionomer E, wherein Ionomer E has a MI of 5 g/10 min and is derived from a poly(ethylene-co-methacrylic acid) that contains, based on the total weight of the acid copolymer, 18 wt % repeat units of methacrylic acid and has 30% of its total carboxylic acid content neutralized with zinc;

TI 7 is a 1 mil (0.03 mm) thick film made of Terionomer A;

TI 8 is a 1 mil (0.03 mm) thick film made of Terionomer D, wherein Terionomer D has a MI of 25 g/10 min and is derived from a poly(ethylene-co-n-butyl acrylate-co-methacrylic acid) that contains, based on the total weight of the acid terpolymer, 23 wt % repeat units of n-butyl acrylate and 9 wt % repeat units of methacrylic acid and has 15% of its total carboxylic acid content neutralized with zinc;

TI 9 is a 1 mil (0.03 mm) thick film made of a composition comprising, based on the total weight of the composition, 99.4 wt % of Terionomer B, 0.3 wt % of TINUVIN 1577 and 0.3 wt % of CHIMASSORB 944 (Ciba Specialty Chemicals);

TI 10 is a 20 mil (0.51 mm) thick embossed trilayer sheet having two 1 mil (0.03 mm) thick surface sub-layers made of Terionomer D and an inner sub-layer made of Surlyn® 9950 (DuPont);

TI 11 is a 20 mil (0.51 mm) thick embossed trilayer sheet having two 2 mil (0.06 mm) thick surface sub-layers made of Terionomer B and an inner sub-layer made of Ionomer B;

TI 12 is a 20 mil (0.51 mm) thick embossed trilayer sheet having two 1 mil (0.03 mm) thick surface sub-layers made of Terionomer C and an inner sub-layer made of Ionomer E, wherein Ionomer E has a MI of 5 g/10 min and is derived from a poly(ethylene-co-methacrylic acid) that contains, based on the total weight of the acid copolymer, 15 wt % repeat units of methacrylic acid and has 30% of its total carboxylic acid content neutralized with zinc;

TI 13 was a terionomer having a MI of 10 g/10 min and derived from a poly(ethylene-co-n-butylacrylate-co-methacrylic acid) that contained, based on the total weight of the acid copolymer, 23.5 wt % repeat units of n-butylacrylate, 9 wt % repeat units of methacrylic acid, and had 19% of its total carboxylic acid content neutralized with zinc ion;

TI 14 was a terionomer having a MI of 5 g/10 min and derived from a poly(ethylene-co-n-butylacrylate-co-methacrylic acid) that contained, based on the total weight of the acid copolymer, 23.5 wt % repeat units of n-butylacrylate, 9 wt % repeat units of methacrylic acid, and had 32% of its total carboxylic acid content neutralized with zinc ion;

TI 15 was a terionomer having a MI of 5 g/10 min and a melting point of 81° C. and derived from a poly(ethylene-co-isobutylacrylate-co-methacrylic acid) that contained, based on the total weight of the acid copolymer, 10 wt % repeat units of isobutylacrylate, 10 wt % repeat units of methacrylic acid, and had 16% of its total carboxylic acid content neutralized with zinc ion;

TPT is a Akasol® PTL 3-38/75 film layer (Akasol® film layer; August Krempel Soehne GmbH & Co., Germany) described as a 7 mil thick white poly(vinylidene fluoride)/poly(ethylene terephthalate)/poly(vinylidene fluoride) tri-layer film with primer.

Examples 1-14

A series of 12×12 in (305×305 mm) solar cell laminate structures described below in Table 1 are assembled and laminated by Lamination Process 1. Layers 1 and 2 constitute the incident layer and the front encapsulant layer, respectively, and Layers 4 and 5 constitute the back encapsulant layer and the backing layer, respectively.

TABLE 1

Laminate Structures

| Example | Layer 1 | Layer 2 | Layer 3 | Layer 4 | Layer 5 |
|---|---|---|---|---|---|
| 1, 15 | Glass 4 | TI 3 | Solar Cell 1 | TI 3 | FPF |
| 2, 16 | Glass 4 | TI 3 | Solar Cell 2 | TI 1 | Glass 1 |
| 3, 17 | Glass 4 | TI 5 | Solar Cell 3 | TI 5 | TPT |
| 4, 18 | Glass 4 | TI 5 | Solar Cell 4 | TI 2 | Glass 1 |
| 5, 19 | FPF | TI 6 | Solar Cell 1 | TI 6 | AL |
| 6, 20 | Glass 4 | EVA | Solar Cell 2 | TI 4 | Glass 1 |
| 7, 21 | FPF | TI 10 | Solar Cell 1 | TI 10 | FPF |
| 8, 22 | Glass 1 | TI 10 | Solar Cell 2 | PVB | PET 1 |
| 9, 23 | Glass 4 | TI 11 | Solar Cell 3 | TI 11 | TPT |
| 10, 24 | Glass 4 | TI 11 | Solar Cell 4 | ION 2 | AL |
| 11, 25 | Glass 4 | ION 3 | Solar Cell 1 | TI 11 | Glass 1 |
| 12, 26 | Glass 4 | TI 12 | Solar Cell 2 | TI 12 | FPF |
| 13, 27 | Glass 4 | TI 12 | Solar Cell 1 | PVB-A | Glass 1 |
| 14, 28 | Glass 4 | TI 12 | Solar Cell 4 | ION 1 | |

Examples 15-28

A series of 12×12 in (305×305 mm) solar cell laminate structures described above in Table 1 are assembled and laminated by Lamination Process 2. Layers 1 and 2 constitute the incident layer and the front encapsulant layer, respectively, and Layers 4 and 5 constitute the back encapsulant layer and the backing layer, respectively.

Examples 29-35

The tri-layer sheet structures described below in Table 2 were produced through conventional coextrusion cast sheet processes. The inner layer (Layer 2) composition noted below in Table 2 was fed into a 1.5 in (3.8 cm) diameter Killion® extruder (extruder A) with a temperature profile as follow:

| Extruder Zone | Temperature (° C.) |
| --- | --- |
| Feed | Ambient |
| Zone 1 | 200 |
| Zone 2 | 200 |
| Zone 3 | 200 |
| Block | 220 |
| Die | 220 |

The composition for the surface layers (Layers 1 and 3) listed below in Table 2 was fed into a 1.25 inch (3.2 cm) diameter Killion® extruder (extruder B) with a temperature profile as follow:

| Extruder Zone | Temperature (° C.) |
| --- | --- |
| Feed | Ambient |
| Zone 1 | 200 |
| Zone 2 | 200 |
| Zone 3 | 200 |

Extruder A throughput was controlled by adjusting the screw speed to 71.4 rpm. Extruder B throughput was controlled by adjusting the screw speed to 19.5 rpm for Examples 29-34 and 90 rpm for Example 35. The extruders fed a 14 in (36 cm) "coat hanger" coextrusion die with a nominal gap of 0.03 in (0.8 mm). The polymer extruded from extruder A formed the inner layer and the polymer extruded from extruder B formed both the surface layers of the tri-layer sheet. The as-cast tri-layer sheet was fed into a three roll stack consisting of a 6 inch (15 cm) diameter rubber nip roll covered with a Teflon® release film and two 12 inch (30 cm) diameter polished chrome chill rolls held at a temperature of between 6° C. and 12° C. The tri-layer sheet was then wound onto cardboard cores at a rate of 4.3 feet/min (1.3 m/min).

TABLE 2

| | Tri-layer Sheet Structure | | |
| --- | --- | --- | --- |
| Example | Layer 1 (thickness (in)) | Layer 2 (thickness (in)) | Layer 3 (thickness (in)) |
| 29 | TI 13 (0.002) | ION 4 (0.016) | TI 13 (0.002) |
| 30 | TI 14 (0.002) | ION 4 (0.017) | TI 14 (0.002) |
| 31 | TI 13 (0.002) | ION 5 (0.019) | TI 13 (0.002) |
| 32 | TI 14 (0.002) | ION 5 (0.018) | TI 14 (0.002) |
| 33 | TI 13 (0.002) | ION 6 (0.016) | TI 13 (0.002) |
| 34 | TI 14 (0.002) | TI 15 (0.016) | TI 14 (0.002) |
| 35 | TI 14 (0.006) | ION 4 (0.016) | TI 14 (0.006) |

Comparative Example CE1

6×6 in (152×152 mm) pre-lamination assemblies were prepared by stacking a 3.2 mm thick Krystal Klear® glass layer (Krystal Klear® glass layer; AFG Industries, Inc., Kingsport, Tenn.), two layers of 20 mil (0.51 mm) thick sheet composed of ION 4, and an Akasol® film layer. The pre-lamination assemblies were then laminated within a Meier laminator. The lamination cycle included an evacuation step (vacuum of 1 mbar) of 5.5 minutes, a pressure build up step of 1 minute and a pressing stage (pressure of 999 mbar) of 4 minutes at a temperature of 155° C.

Two resulting laminate samples were subjected to 180° peel strength adhesion testing between the polymer layer and the glass layer using an Instron® Model # 1125 (1000 lb (454 kg) test frame) Tester in accordance to ASTM D903 as modified with a cross-head speed of 100 mm/min. The results are shown in Table 3, below.

The two laminate samples were also kept in an environment of 85° C. and 85% relative humidity for 840 hours prior to the 180° peel strength testing between the polymer layer and the glass layer, with the results listed also below in Table 3.

TABLE 3

| | | Initial | | Damp Heat Aged | |
| --- | --- | --- | --- | --- | --- |
| Example | Sample | Maximum Load (lb-f (N)) | Peel Strength (lb-f/in (N/mm)) | Maximum Load (lb-f (N)) | Peel Strength (lb-f/in (N/mm)) |
| CE 1 | 1 | 87.2 (388) | Cohesive failure | 23.3 (104) | 16.8 (2.9) |
| | 2 | 91.1 (405) | Cohesive failure | 22.2 (99) | 16.7 (2.9) |
| 36 | | 61.1 (272) | 45.4 (8) | 49.6 (221) | 36.9 (6.5) |
| 37 | | 92.3 (411) | 39.8 (8) | 48.6 (216) | 37.3 (6.5) |
| 38 | | 65.1 (290) | 44 (7.7) | 48.5 (216) | 34.7 (6.1) |
| 39 | | 54.1 (241) | 35.4 (6.2) | 64.6 (287) | 50.7 (8.9) |
| 40 | | 85.2 (379) | 74 (13) | 81.5 (363) | 71.9 (12.6) |

Examples 36-40

Laminate samples similar as those in Comparative Example CE1 were prepared by replacing the two ION 4 sheets with the tri-layer sheet listed below in Table 4 with a lamination temperature of 150° C. The resulting laminates were subjected to 1800 peel strength adhesion testing as described in Comparative Example CE1 with the results tabulated in Table 3 above. The laminates were also kept in an environment of 85° C. and 85% relative humidity for 950 hours prior to the 1800 peel strength testing between the polymer layer and the glass layer, with the results tabulated above in Table 3. As shown in Table 3, the 1800 peel strength for the ionomer sheets (Comparative Example CE1) reduced dramatically from cohesive failure to about 3 N/mm after the damp heat aging, while for the terionomer tri-layer sheets (Examples 36-40), about 75% of the peel strength was maintained after the damp heat aging.

TABLE 4

| Example | Polymer Sheet (Example No.) |
|---|---|
| 36 | 29 |
| 37 | 30 |
| 38 | 33 |
| 39 | 34 |
| 40 | 35 |

The invention claimed is:

1. A solar cell pre-lamination assembly comprising a bi-layer film or sheet and a solar cell component formed of one or a plurality of electronically interconnected solar cells, wherein,
   the solar cell component has a light-receiving side that faces a light source and a back side that is opposite from the light source;
   the bi-layer film or sheet consists of a first surface sub-layer and a second surface sub-layer;
   the first surface sub-layer consists essentially of a terionomer;
   the second surface sub-layer consists essentially of a high melting point polymer comprising an ionomer;
   the terionomer is an acid terpolymer that is about 5% to about 90% neutralized with one or more metal ions, based on the total carboxylic acid content of the acid terpolymer, and comprises repeat units derived from an α-olefin, about 5 to about 15 wt % of an α,β-ethylenically unsaturated carboxylic acid having 3 to 8 carbons, and about 15 to about 40 wt % of an α,β-ethylenically unsaturated carboxylic acid ester having 4 to 12 carbons, based on the total weight of the acid terpolymer; and
   the high melting point polymer has a melting point of at least about 80° C.

2. The assembly of claim 1, wherein the acid terpolymer is about 10% to about 50% neutralized with a metal ion selected from the group consisting of sodium, lithium, magnesium, zinc, and mixtures of two of more thereof, based on the total carboxylic acid content of the acid terpolymer, and comprises about 7 to 11 wt % of repeat units of the α,β-ethylenically unsaturated carboxylic acid and about 20 to about 30 wt % of repeat units of the α,β-ethylenically unsaturated carboxylic acid ester, based on the total weight of the acid terpolymer; and wherein the high melting point polymer is an ionomer having a melting point of at least 90° C.

3. The assembly of claim 1, wherein the terionomer is poly(ethylene-co-butyl acrylate-co-methacrylic acid) that is about 20% to about 40% neutralized with zinc, based on its total carboxylic acid content.

4. The assembly of claim 1, wherein the terionomer is a poly(ethylene-co-butyl acrylate-co-methacrylic acid) that is about 20% to about 40% neutralized with zinc, based on its total carboxylic acid content.

5. The assembly of claim 1, wherein the solar cell is selected from the group consisting of multi-crystalline solar cells, thin film solar cells, compound semiconductor solar cells, amorphous silicon solar cells, and combinations of two or more.

6. The assembly of claim 1, which comprises a front encapsulant layer positioned next to the light-receiving side of the solar cell component and a back encapsulant layer positioned next to the back side of the solar cell component, wherein the front encapsulant layer is formed of the bi-layer film or sheet and the back encapsulant layer is formed of a polymeric material selected from the group consisting of acid copolymers, ionomers, ethylene vinyl acetates, poly(vinyl acetals) (including acoustic grade poly(vinyl acetals), polyurethanes, polyvinylchlorides, polyethylenes, polyolefin block elastomers, poly(α-olefin-co-α,β-ethylenically unsaturated carboxylic acid ester) copolymers, silicone elastomers, epoxy resins, and combinations thereof.

7. A solar cell pre-lamination assembly comprising (a) a solar cell component formed of one or a plurality of electronically interconnected solar cells and having a light-receiving side that faces a light source and a back side that is opposite from the light source; (b) a front encapsulant layer positioned next to the light-receiving side of the solar cell component; and (c) a back encapsulant layer positioned next to the back side of the solar cell component, (i) wherein each of the front encapsulant layer and back encapsulant layer is formed of a bi-layer film or sheet consisting of a first surface sub-layer consisting essentially of a terionomer and a second surface sub-layer consisting essentially of a high melting point polymer comprising an ionomer having a melting point of at least about 80° C.; and (ii) wherein the terionomer is an acid terpolymer that is about 5% to about 90% neutralized with one or more metal ions, based on the total carboxylic acid content of the acid terpolymer, and comprises repeat units derived from an α-olefin, about 5 to about 15 wt% of an α,β-ethylenically unsaturated carboxylic acid having 3 to 8 carbons, and about 15 to about 40 wt% of an α,β-ethylenically unsaturated carboxylic acid ester having 4 to 12 carbons, based on the total weight of the acid terpolymer.

8. The assembly of claim 6, further comprising an incident layer positioned next to the front encapsulant layer and a backing layer positioned to the back encapsulant layer.

9. The assembly of claim 8, wherein the incident layer is selected from the group consisting of (i) glass sheets, (ii) polymeric sheets formed of polycarbonates, acrylics, polyacrylates, cyclic polyolefins, polystyrenes, polyamides, polyesters, fluoropolymers, or combinations of two or more thereof, and (iii) polymeric films formed of polyesters, polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, or combinations of two or more thereof.

10. The assembly of claim 8, wherein the backing layer is selected from (i) glass sheets, (ii) polymeric sheets, (iii) polymeric films, (iv) metal sheets, and (v) ceramic plates, and wherein the polymeric sheets comprise or are formed of polycarbonates, acrylics, polyacrylates, cyclic polyolefins, polystyrenes, polyamides, polyesters, fluoropolymers, or combinations or two or more thereof; and the polymeric films comprise or are formed of polyesters, polycarbonates, polyolefins, norbornene polymers, polystyrenes, styrene-acrylate copolymers, acrylonitrile-styrene copolymers, polysulfones, nylons, polyurethanes, acrylics, cellulose acetates, cellophanes, poly(vinyl chlorides), fluoropolymers, or combinations of two or more thereof.

11. The assembly of claim 1, consisting essentially of, from a top side that faces the light source to a bottom side that is opposite from the light source, (i) an incident layer that is positioned next to, (ii) a front encapsulant layer that is positioned next to, (iii) the solar cell component that is positioned next to, (iv) a back encapsulant layer that is positioned next to, (v) a backing layer, wherein the front encapsulant layer or the back encapsulant layers, or both, is formed of the bi-layer film or sheet.

12. A process comprising: (i) providing a solar cell pre-lamination assembly and (ii) laminating the assembly to form a solar cell module, wherein the assembly is as recited in claim 1.

13. The process of claim 12, wherein the laminating step is conducted by subjecting the assembly to heat.

14. The process of claim 13, wherein the laminating step further comprises subjecting the assembly to vacuum or pressure.

15. A solar cell module produced from a solar cell pre-lamination assembly as claimed in claim 1.

16. The solar cell module of claim 15, wherein at least about 75% of the 180° peel strength between the bi-layer film or sheet and its adjacent layer(s) is maintained after the module has been conditioned for 1000 hours at a temperature of about 85° C. and a relative humidity of about 85%.

17. The solar cell pre-lamination assembly of claim 1 wherein the high melting point polymer is a polymer selected from the group consisting of acid copolymers, ionomers, poly(ethylene-co-vinyl acetates), thermoplastic polyurethanes, poly(vinyl chlorides), polyethylenes, poly($\alpha$-olefin-co-$\alpha$,$\beta$-ethylenically unsaturated carboxylic acid ester) copolymers, polyesters, and epoxy resins.

18. The solar cell pre-lamination assembly of claim 1, wherein the high melting point polymer is an acid copolymer.

19. The solar cell pre-lamination assembly of claim 1, wherein the high melting point polymer is an ionomer of an acid copolymer that comprises copolymerized units of an $\alpha$-olefin and an $\alpha$,$\beta$-ethylenically unsaturated carboxylic acid and is neutralized to a level of about 1% to about 90%, based on the total carboxylic acid content of the acid copolymer.

20. The solar cell pre-lamination assembly of claim 1, wherein the high melting point polymer is an ionomer of an acid copolymer that comprises copolymerized units of an $\alpha$-olefin and an $\alpha$,$\beta$-ethylenically unsaturated carboxylic acid and is neutralized with metallic ion selected from the group consisting of sodium, zinc, magnesium, and lithium to a level of about 10% to about 40%, based on the total carboxylic acid content of the acid copolymer.

21. The solar cell pre-lamination assembly of claim 1, wherein the $\alpha$-olefin is ethylene, the $\alpha$,$\beta$-ethylenically unsaturated carboxylic acid is selected from the group consisting of acrylic acids, methacrylic acids, itaconic acids, maleic acids, maleic anhydrides, fumaric acids, monomethyl maleic acids, and mixtures of two or more thereof, and the $\alpha$,$\beta$-ethylenically unsaturated carboxylic acid ester is selected from the group consisting of methyl acrylates, methyl methacrylates, ethyl acrylates, ethyl methacrylates, isopropyl acrylates, isopropyl methacrylates, butyl acrylates, butyl methacrylates, and mixtures of two or more thereof.

22. The solar cell pre-lamination assembly of claim 1, wherein the $\alpha$-olefin is ethylene, the $\alpha$,$\beta$-ethylenically unsaturated carboxylic acid is selected from the group consisting of acrylic acids, methacrylic acids, and mixtures of two or more thereof, and the $\alpha$,$\beta$-ethylenically unsaturated carboxylic acid ester is selected from the group consisting of methyl acrylates and butyl acrylates.

23. The solar cell pre-lamination assembly of claim 2, wherein the $\alpha$-olefin is ethylene, the $\alpha$,$\beta$-ethylenically unsaturated carboxylic acid is selected from the group consisting of acrylic acids, methacrylic acids, itaconic acids, maleic acids, maleic anhydrides, fumaric acids, monomethyl maleic acids, and mixtures of two or more thereof, and the $\alpha$,$\beta$-ethylenically unsaturated carboxylic acid ester is selected from the group consisting of methyl acrylates, methyl methacrylates, ethyl acrylates, ethyl methacrylates, isopropyl acrylates, isopropyl methacrylates, butyl acrylates, butyl methacrylates, and mixtures of two or more thereof.

24. The solar cell pre-lamination assembly of claim 2, wherein the $\alpha$-olefin is ethylene, the $\alpha$,$\beta$-ethylenically unsaturated carboxylic acid is selected from the group consisting of acrylic acids, methacrylic acids, and mixtures of two or more thereof, and the $\alpha$,$\beta$-ethylenically unsaturated carboxylic acid ester is selected from the group consisting of methyl acrylates and butyl acrylates.

* * * * *